United States Patent [19]

Kawata et al.

[11] Patent Number: 5,027,423
[45] Date of Patent: Jun. 25, 1991

[54] IMAGE-PROCESSING INTEGRATED CIRCUIT DEVICE

[75] Inventors: Tetsuro Kawata; Eiri Hashimoto; Nobuaki Miyakawa, all of Kanagawa, Japan

[73] Assignee: Fuji Xerox Co., Ltd., Tokyo, Japan

[21] Appl. No.: 378,543

[22] Filed: Jul. 12, 1989

[30] Foreign Application Priority Data

Jul. 15, 1988 [JP] Japan .............................. 63-176442

[51] Int. Cl.$^5$ .............................................. G06K 9/40
[52] U.S. Cl. .................................... 382/54; 382/27; 364/724.01; 364/724.16
[58] Field of Search ............... 382/54, 27; 364/724.01, 364/724.03, 724.05, 724.15, 724.16, 748

[56] References Cited

U.S. PATENT DOCUMENTS

| | | | |
|---|---|---|---|
| 4,782,458 | 11/1988 | Bhattacharya et al. | 364/724.16 |
| 4,843,581 | 6/1989 | Cupo et al. | 364/724.01 |
| 4,853,969 | 8/1989 | Weideman | 382/54 |
| 4,860,373 | 8/1989 | Hartless et al. | 382/54 |
| 4,862,403 | 8/1989 | Iwase et al. | 364/724.16 |
| 4,866,648 | 9/1989 | Usui | 364/724.01 |

Primary Examiner—David K. Moore
Assistant Examiner—Yon Jung
Attorney, Agent, or Firm—Finnegan, Henderson, Farabow, Garrett, and Dunner

[57] ABSTRACT

An image-processing integrated circuit device comprises a delay circuit and adder group, a multiplication block group, and an adder group. Image data in a window are fed to the delay circuit and adder group simultaneously row by row and then added up for every symmetrical positions in the window. The respective sums of the image data thus added up for every symmetrical positions are multiplied by corresponding coefficient data in the multiplication block group. Lastly, the respective results of multiplication obtained from the multiplication block group are added up by the adder group to thereby obtain a filter output. The delay circuit and adder group, the multiplication block group, and the adder group can be integrated to form one image-processing integrated circuit device. Accordingly, the number of parts is reduced. Further, not only the image data can be fed into the delay circuit and adder group simultaneously but also the multiplication in the multiplication block group can be carried out in parallel and simultaneously by using exclusive multiplication blocks each provided for symmetrical positions in the window. Accordingly, the speed in filtering processing becomes high.

4 Claims, 5 Drawing Sheets

FIG. 3a { COEFFICIENT DATA A  0. 1 0 1 1 0 1 1 0
         COEFFICIENT DATA A' 0. 0 0 0 1 1 0 1 0 1 1 1

FIG. 3b { COEFFICIENT DATA A   | 1 0 1 1 0 1 1 0 |
         COEFFICIENT DATA A'  | 0 0 0 1 1 0 1 0 1 1 1 |

FIG. 3c { COEFFICIENT DATA A   | 1 0 1 1 0 1 1 0 |
         COEFFICIENT DATA A'  | 1 1 0 1 0 1 1 1 |

FIG. 4

| $d_{11}$ | $d_{12}$ | $d_{13}$ | $d_{14}$ | $d_{15}$ | } $M_1$ |
| $d_{21}$ | $d_{22}$ | $d_{23}$ | $d_{24}$ | $d_{25}$ | } $M_2$ |
| $d_{31}$ | $d_{32}$ | $d_{33}$ | $d_{34}$ | $d_{35}$ | } $M_3$ |
| $d_{41}$ | $d_{42}$ | $d_{43}$ | $d_{44}$ | $d_{45}$ | } $M_4$ |
| $d_{51}$ | $d_{52}$ | $d_{53}$ | $d_{54}$ | $d_{55}$ | } $M_5$ |

FIG. 5

| $\omega_{11}$ | $\omega_{12}$ | $\omega_{13}$ | $\omega_{14}$ | $\omega_{15}$ |
| $\omega_{21}$ | $\omega_{22}$ | $\omega_{23}$ | $\omega_{24}$ | $\omega_{25}$ |
| $\omega_{31}$ | $\omega_{32}$ | $\omega_{33}$ | $\omega_{34}$ | $\omega_{35}$ |
| $\omega_{41}$ | $\omega_{42}$ | $\omega_{43}$ | $\omega_{44}$ | $\omega_{45}$ |
| $\omega_{51}$ | $\omega_{52}$ | $\omega_{53}$ | $\omega_{54}$ | $\omega_{55}$ |

FIG. 6

| a | b | c | b | a |
| b | d | e | d | b |
| c | e | f | e | c |
| b | d | e | d | b |
| a | b | c | b | a |

IMAGE-PROCESSING INTEGRATED CIRCUIT DEVICE

BACKGROUND OF THE INVENTION

1. Field of the Invention

The present invention relates to an image-processing integrated circuit device for carrying out the two-dimensional FIR (Finite Impulse Response) digital filtering processing of image data.

2. Description of the Prior Art

Heretofore, two types of image-processing integrated circuit devices have been used for carrying out the two-dimensional FIR digital filtering processing of image data, one being a device using a plurality of one-dimensional digital filter LSIs (Large-Scale Integrated Circuits) in combination, the other being a device using a two-dimensional digital filter LSI.

First Prior Art System

Figure 7:
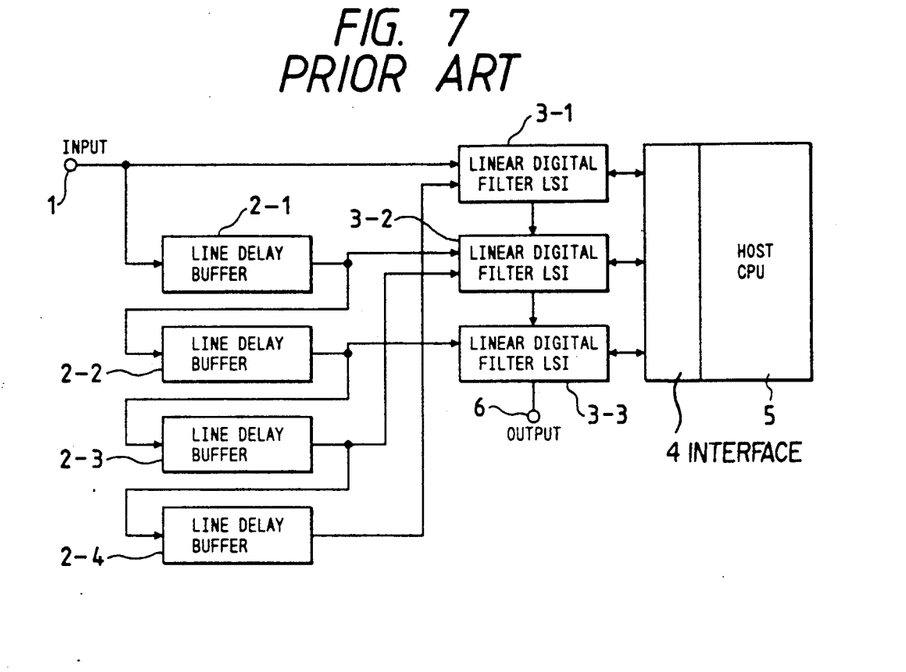
FIG. 7 is a diagram of a first prior art example.

Referring to FIG. 7, there is shown a first prior art example using a plurality of one-dimensional digital filter LSIs in combination and having a window size of 5×5. In FIG. 7, there are provided an input terminal 1, line delay buffers 2-1 through 2-4, one-dimensional digital filter LSIs 3-1 through 3—3, an interface 4, a host CPU (Central Processing Unit) 5, and an output terminal 6.

Figure 4:
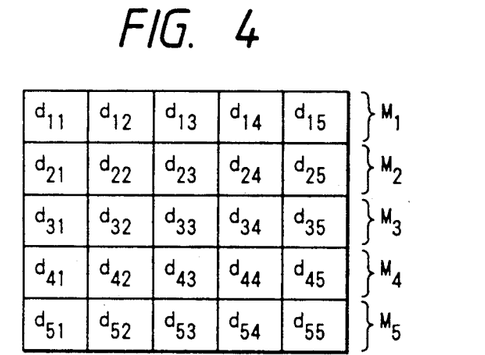
FIG. 4 is a view showing image data in a 5×5 window.

FIG. 4 shows image data in a 5×5 window. Image data in the 5×5 window are supplied successively through the input terminal 1. For example, image data in a row $M_1$ as shown in FIG. 4 are supplied successively in the order of $d_{15}$, $d_{14}$, $d_{13}$, $d_{12}$ and $d_{11}$.

When one row of the image data constituting the window are supplied, the data are delayed by the line delay buffer 2-1 for a period required for reading one line in a screen. Thereafter, whenever one row of the image data constituting the window are supplied, the row of image data are delayed in the same manner as described above. Such delay makes it possible to feed all the image data into the one-dimensional digital filter LSIs 3-1 to 3—3 simultaneously and timely when the last fifth row of the image data are supplied.

Filtering processing is carried out by multiplying the image data by coefficient data and by adding the results of the multiplications.

Figure 5:
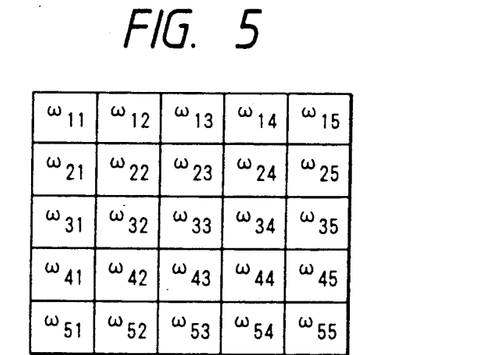
FIG. 5 is a view showing coefficient data in the 5×5 window.

FIG. 5 is a view showing coefficient data determined corresponding to the image data in the 5×5 window. For example, $\omega_{11}$ represents a coefficient data by which the image data $d_{11}$ is multiplied, and $\omega_{15}$ represents a coefficient data by which the image data $d_{15}$ is multiplied.

The values of the coefficient data are given corresponding to the respective image data in the window. However, the coefficient data of the same value may be given for image data in different positions within the window. For example, the same value may be given for image data in symmetrical positions within the window. Various methods can be used for designating such symmetrical positions. As one method, the same value may be given for image data being vertically, horizontally and obliquely symmetrical with respect to the center (the position of $d_{33}$ in FIG. 4) of the window.

Figure 6:
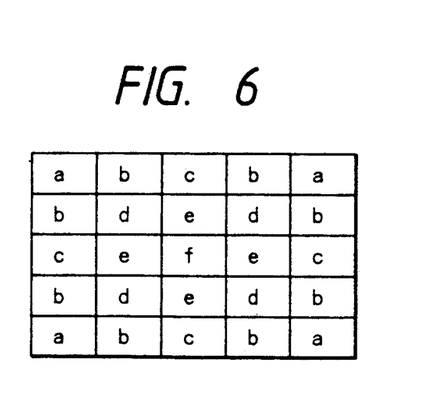
FIG. 6 is a view showing the symmetry of coefficient data in the 5×5 window.

FIG. 6 is a view showing an example of symmetry in coefficient data in the 5×5 window. In this example, the positions of the same alphabet designate symmetrical positions. Accordingly, the coefficient data $\omega_{11}$, $\omega_{15}$, $\omega_{51}$ and $\omega_{55}$ in the symmetrical positions a have the same value.

Therefore, in FIG. 7, the image data in the rows $M_1$ and $M_5$ having a symmetrical relation are fed to the one-dimensional digital filter LSI 3-1; the image data in the rows $M_2$ and $M_4$ are fed to the one-dimensional digital filter LSI 3-2; and the image data in the remaining row $M_3$ are fed to the one-dimensional digital filter LSI 3—3.

In each of the one-dimensional digital filter LSIs, the image data are multiplied by the coefficient data corresponding to the aforementioned symmetrical positions and then the results of multiplications are added to each other. Lastly, the sum of the results of addition in the one-dimensional digital filter LSIs is obtained as a filter output from the output terminal 6.

The operation of the one-dimensional digital filter LSIs 3-1 to 3—3 is controlled by the host CPU 5 through the interface 4.

Second Prior Art System

Figure 8:
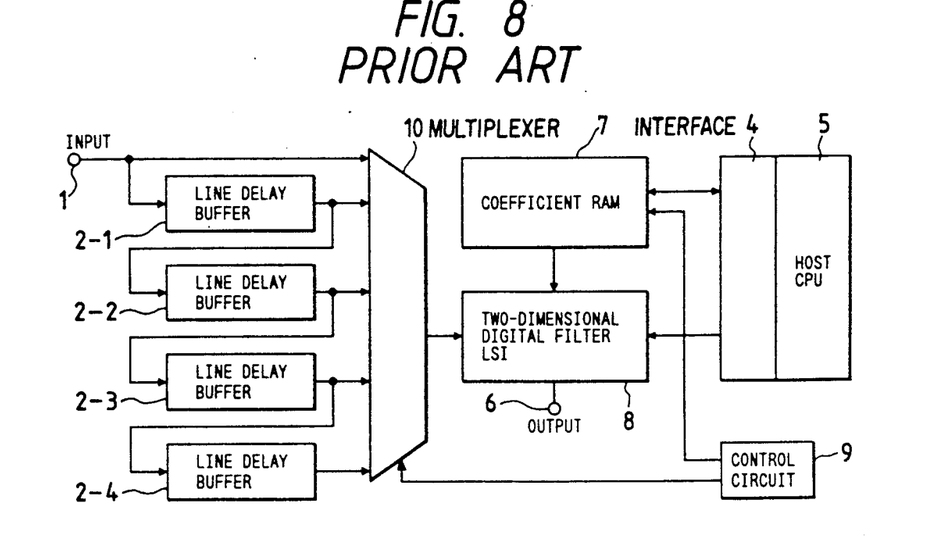
FIG. 8 is a diagram of a second prior art example.

Referring to FIG. 8, there is shown a second prior art example using a two-dimensional digital filter LSI and having a window size of 5×5.

Items in FIG. 8 corresponding to those in FIG. 7 are referenced correspondingly. In FIG. 8, the reference numeral 7 designates a coefficient RAM (Random Access Memory), 8 a two-dimensional digital filter LSI, 9 a control circuit, and 10 a multiplexer. The coefficient RAM 7 is provided for storing coefficient data therein by which image data are multiplied.

The two-dimensional digital filter LSI 8 shown in FIG. 8 can carry out two-dimensional digital filtering processing by itself, but cannot process all the data in the window simultaneously. In short, the LSI 8 cannot but process all data rows which are constituent members of the window. Accordingly, the data must be fed to the LSI 8 through the multiplexer 10, row by row.

The control circuit 9 is provided for controlling operation of the multiplexer 10 and for controlling the address of the coefficient RAM 7.

Problems in the prior art are as follows.

Problems in the first prior art system are: (a) a large number of parts are required; and (b) it is impossible to change filtering characteristics in a real-time operation in the middle of filtering processing to obtain higher picture quality.

It is apparent from FIG. 7 that parts increase in number because a plurality of one-dimensional digital filter LSIs are required for carrying out two-dimensional digital filtering processing.

The reason why the filtering characteristic cannot be changed in a real-time operation is as follows.

In each of the one-dimensional digital filter LSIs shown in FIG. 7, multiplication can be carried out by using a multiplier or by a table look-up method in which the results of image data multiplied by coefficient data are stored in the form of a table in a RAM in advance so that the results can be respectively read when the image data are given as addresses.

In the case where such a table look-up method is employed, the filtering characteristic is determined by values in the table. Accordingly, the values in the table must be rewritten if a different filtering characteristic is required. It is, however, impossible that the rewriting be carried out in a real-time operation in the middle of filtering processing according to the requirement. In short, it is impossible to change the filtering characteristic in a real-time operation.

Problems in the second prior art example are in that (a) a large number of parts are required; and (b) the processing speed is slow.

It is apparent from FIG. 8 that parts increase in number because the coefficient RAM 7, the control circuit 9, the multiplexer 10 and the like, as well as the two-dimensional digital filter LSI 8, are required.

The reason why the processing speed is slow is that the two-dimensional digital filter LSI 8 cannot process all the rows of data in the window simultaneously and must process the data given by the multiplexer, row by row.

SUMMARY OF THE INVENTION

It is therefore an object of the present invention to solve the aforementioned problems.

To solve the aforementioned problems, according to an aspect of the present invention, the image-processing integrated circuit device comprises: a delay circuit and adder group for adding up image data in a window for every group of ones of the image data corresponding to coefficient data of the same value; a multiplication block group for multiplying the results of the addition for the every group of ones of the image data by a corresponding one of the coefficient data; and an adder group for adding the results of the multiplication for all the groups of the image data obtained from the multiplication block group to thereby obtain a filter output.

In the case where the filtering characteristic is to be changed, in a real-time operation, each of the multiplication blocks constituting the above-mentioned multiplication block group is provided with a multiplier, a plurality of coefficient data registers for registering coefficient data for every one of the filtering characteristics different from each other, and a switching means responsive to a selection signal for switching coefficient data to be fed from the plurality of coefficient data registers to the multiplier.

In the case where not only the filtering characteristic is to be changed in a real-time operation but also where the accuracy in the filtering processing is to be improved, each of the multiplication blocks constituting the above-mentioned multiplication block group is provided with a multiplier; a plurality of coefficient data registers each for registering the coefficient data corresponding to one of the filtering characteristics different from each other after shifting the coefficient data to be registered so that the first significant digit of the coefficient data to be registered comes to the head of the shift register; a first switching means for switching the coefficient data to be fed from the plurality of coefficient data registers to the multiplier; a plurality of shift-quantity registers provided corresponding to the plurality of coefficient data registers and for registering a quantity of shift equal to the quantity of shift of the coefficient data in the plurality of coefficient data registers; a barrel shifter provided at the output side of the multiplier and having a function of reversely shifting the digits of the result of multiplication; and a second switching means for switching the quantity of shift to be fed from the plurality of shift-quantity registers to the barrel shifter.

According to another aspect of the present invention, in the image-processing integrated circuit device comprising a multiplication block group including multiplication blocks each for multiplying one of the image data by coefficient data corresponding to the image data, and an adder group for adding the results of the multiplication obtained from the multiplication block group to thereby obtain a filter output, each of the multiplication blocks is provided with a multiplier, a plurality of coefficient data registers for registering coefficient data for every one of the filtering characteristics different from each other, and a switching means responsive to a selection signal for switching coefficient data to be fed from the plurality of coefficient data registers to the multiplier.

According to a further aspect of the present invention, in the image-processing integrated circuit device comprising a multiplication block group including multiplication blocks each for multiplying one of the image data by coefficient data corresponding to the image data, and an adder group for adding the results of the multiplication obtained from the multiplication block group to thereby obtain a filter output, each of the multiplication blocks is provided with a plurality of coefficient data registers each for registering the coefficient data corresponding to one of the filtering characteristics different from each other after shifting the coefficient data to be registered so that the first significant digit of the coefficient data to be registered comes to the head of the shift register, a first switching means for switching the coefficient data to be fed from the plurality of coefficient data registers to the multiplier, a plurality of shift-quantity registers provided corresponding to the plurality of coefficient data registers and for registering a quantity of shift equal to the quantity of shift of the coefficient data in the plurality of coefficient data registers, a barrel shifter provided at the output side of the multiplier and having a function for reversely shifting the digits of the result of multiplication, and a second switching means for switching the quantity of shift to be fed from the plurality of shift-quantity registers to the barrel shifter.

In the above configurations according to the invention, operation is performed as follows.

The image data in a window are fed to the delay circuit and adder group simultaneously row by row and then added up for every symmetrical positions in the window.

The respective sums of the image data thus added up for every symmetrical positions are multiplied by corresponding coefficient data in the multiplication block group.

Lastly, the respective results of multiplication obtained from the multiplication block group are added up by the adder group to thereby obtain a filter output.

The delay circuit and adder group, the multiplication block group, and the adder group can be integrated to form one image-processing integrated circuit device. Accordingly, the number of parts is reduced. Further, not only the image data can be fed into the delay circuit and adder group simultaneously but also the multiplication in the multiplication block group can be carried out in parallel and simultaneously by using exclusive multiplication blocks each provided for symmetrical positions in the window. Accordingly, the speed in filtering processing becomes high.

The filtering characteristics can be changed in real-time operation, in the case where a plurality of coefficient data registers for registering coefficient data corresponding to different filtering characteristics are provided so as to be changeable by a switching means.

Not only the filtering characteristic can be changed in real-time operation but also the accuracy in the filtering processing can be improved, in the case where each of the multiplication blocks constituting the above-mentioned multiplication block group is provided with a multiplier, a plurality of coefficient data registers each for registering the coefficient data corresponding to one of filtering characteristics different from each other after shifting the coefficient data to be registered so that the first significant digit of the coefficient data to be registered comes to the head of the shift register, a first switching means for switching the coefficient data to be fed from the plurality of coefficient data registers to the multiplier, a plurality of shift-quantity registers provided corresponding to the plurality of coefficient data registers and for registering a quantity of shift equal to the quantity of shift of the coefficient data in the plurality of coefficient data registers, a barrel shifter provided at the output side of the multiplier and having a function for reversely shifting the digits of the result of multiplication, and a second switching means for switching the quantity of shift to be fed from the plurality of shift-quantity registers to the barrel shifter.

DETAILED DESCRIPTION OF THE PREFERRED EMBODIMENTS

Preferred embodiments of the present invention will be described in detail with reference to the drawings.

Figure 1:
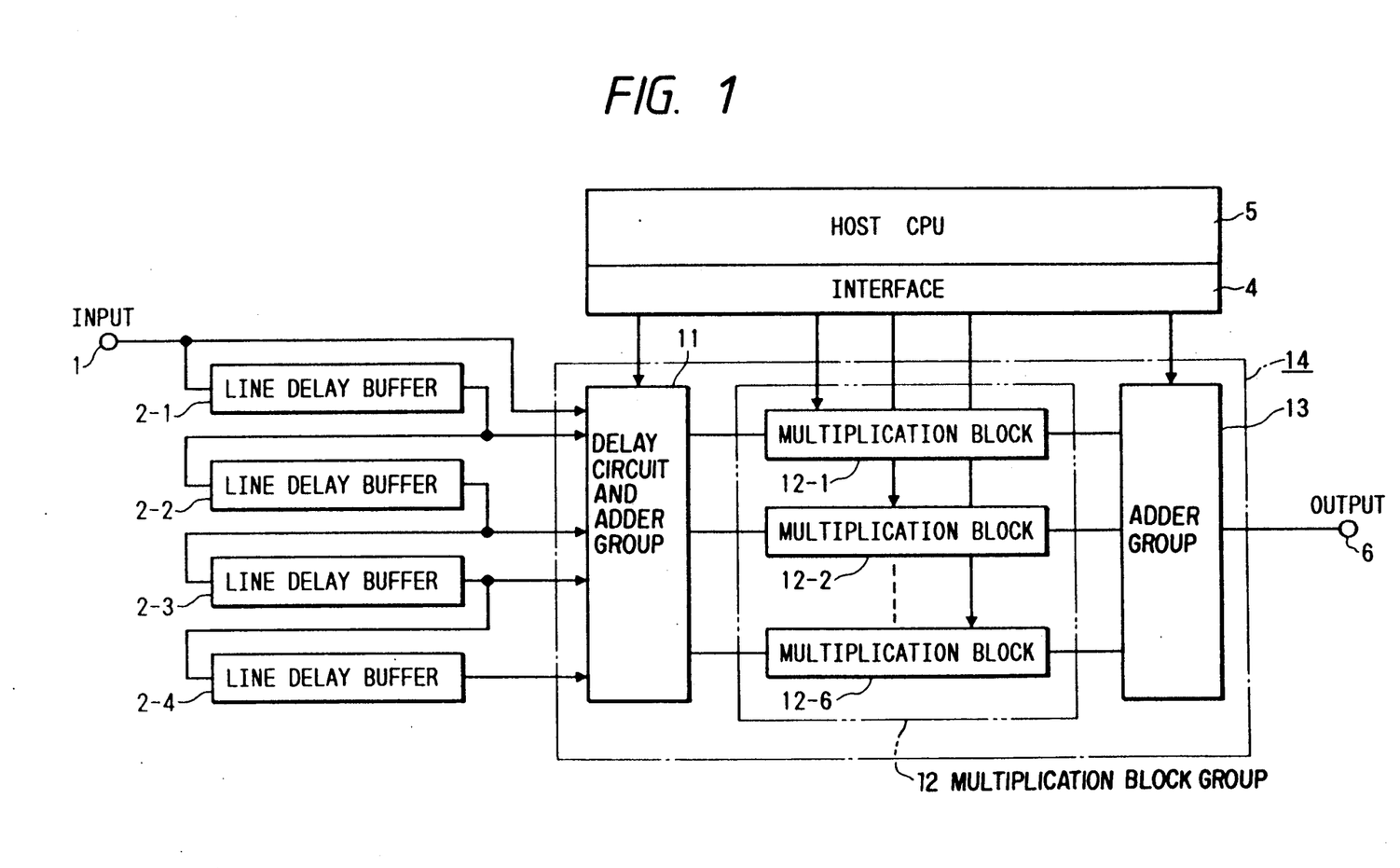
FIG. 1 is a diagram illustrating an embodiment of the image-processing integrated circuit device according to the present invention.

Referring to FIG. 1, there is shown an embodiment of the image-processing integrated circuit device according to the present invention, in the case where the size of a window is 5×5. In FIG. 1, items the same as or equivalent to those in FIG. 7 are referenced correspondingly. In FIG. 1, the reference numeral 11 designates a delay circuit and adder group, 12 a multiplication block group, 12-1 through 12-6 respective multiplication blocks, 13 an adder group, and 14 an image-processing integrated circuit device.

The image-processing integrated circuit device 14 is constituted by the delay circuit and adder group 11, the multiplication block group 12, and the adder group 13. The operations of the parts are controlled by the host CPU 5.

The delay circuit and adder group 11 are provided for previously adding image data located in symmetrical positions within the window.

In the filtering processing, image data are multiplied by predetermined coefficient data and the results are added. Image data located in symmetrical positions within the window are multiplied by the same coefficient data. Therefore, the image data to be multiplied by the same coefficient data are collectively added up in advance.

The feeding of image data from the line delay buffers 2-1 and the like to the delay circuit and adder group 11 are carried out simultaneously with respect to all rows constituting the window. Accordingly, processing speed will not become slow as in the case of FIG. 8.

In the multiplication block group 12, the results of addition by the delay circuit and adder group 11 are multiplied by corresponding coefficient data, respectively. In the case where the symmetry in the 5×5 window is as shown in FIG. 6, six kinds of symmetrical positions a to f exist so that six kinds of coefficient data exist. One multiplication block is assigned for only the multiplication by one coefficient data exclusively. Accordingly, the multiplication blocks are provided equally in number to the number of kinds of coefficient data.

The adder group 13 is are provided for adding the multiplication results obtained by the multiplication block group 12, so that the result of addition is obtained as a filter output.

Figure 2:
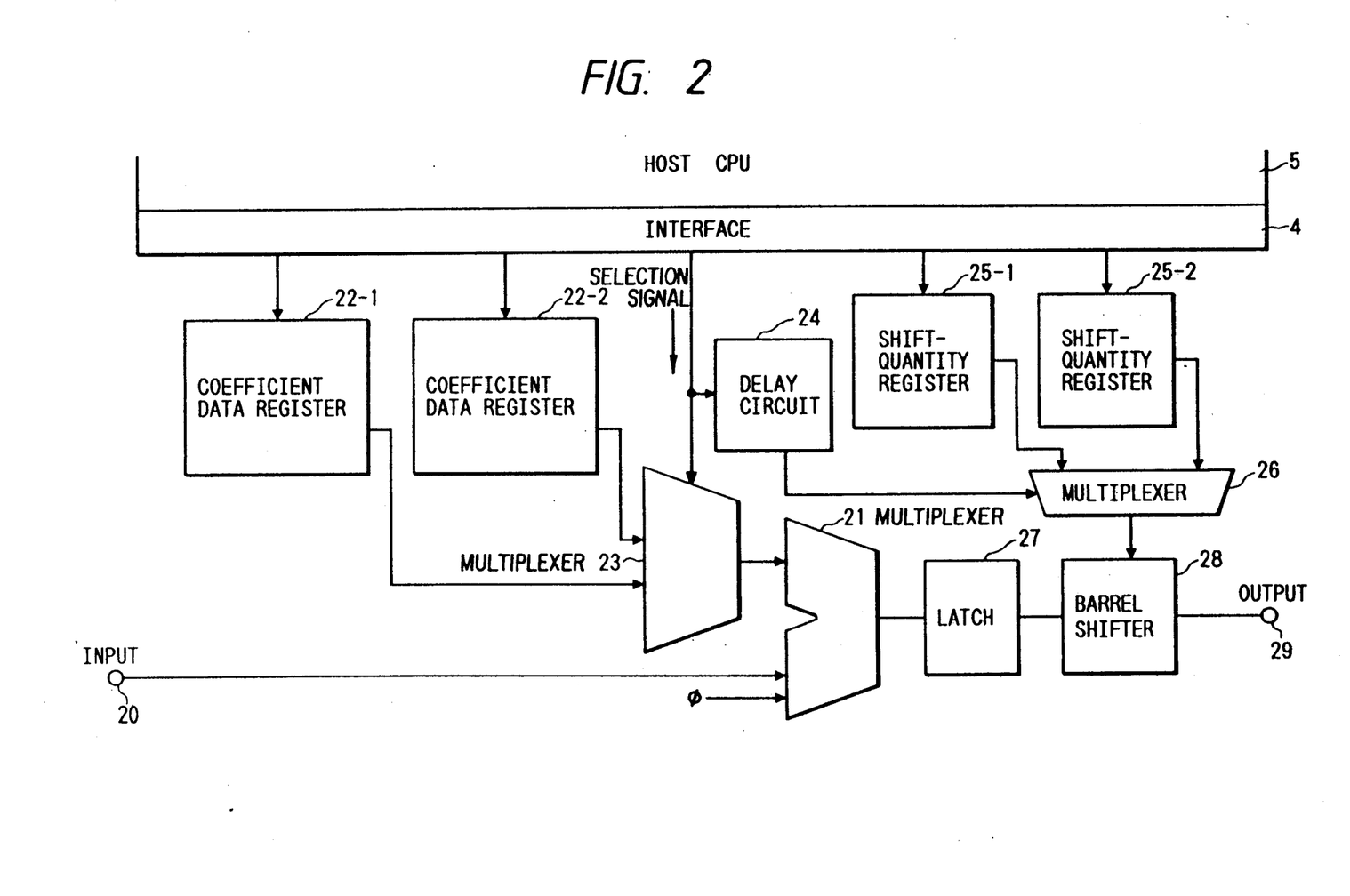
FIG. 2 is a diagram showing in detail one multiplication block used in the present invention.

FIG. 2 is a detailed diagram showing one of the multiplication blocks used in the present invention. As described above, one multiplication block is assigned for only the multiplication by one coefficient data. Description is made herein with respect to the case where the multiplication block is assigned for the multiplication by a coefficient data $\omega_{11}$ ($\omega_{11}=\omega_{15}=\omega_{51}=\omega_{55}$, see FIG. 5) corresponding to the image data located in symmetrical positions.

In FIG. 2, the reference numeral 20 designates an input terminal, 21 a multiplier, 22-1 and 22-2 coefficient data registers, 23 a multiplexer, 24 a delay circuit, 25-1 and 25-2 shift-quantity registers, 26 a multiplexer, 27 a latch, 28 a barrel shifter, and 29 an output terminal.

From the delay circuit and adder group 11 in FIG. 1, the result of addition of image data located in the symmetrical positions a is fed to the input terminal 20. In FIG. 2, the symbol $\phi$ represents a sign bit. In the multiplier 21, the result of addition is multiplied by the corresponding coefficient data $\omega_{11}$.

The coefficient data $\omega_{11}$ is registered in the coefficient data register 22-1. The registration is carried out by the host CPU 5.

A coefficient data (for example, $\omega_{11}'$) in the symmetrical positions a corresponding to another filtering characteristic is registered in the coefficient data register 22-2.

The multiplexer 23 selects one of the coefficient data registers 22-1 and 22-2 on the basis of a selection signal. Accordingly, in the case where the filtering characteristic is to be changed in the middle of a multiplying operation using the coefficient data registered in the coefficient data register 22-1, the filtering characteristic can be changed easily by switching the multiplexer 23. In short, filtering processing can be carried out while the filtering characteristic is changed in a real-time operation if necessary.

Although FIG. 2 shows the case where two coefficient data registers are provided, it is a matter of course that the number of coefficient data registers can be changed corresponding to the number of required filtering characteristics.

In the following, the shift-quantity registers 25-1 and 25-2 are described. Before this, it is necessary to describe a method for registering coefficient data in the coefficient data registers.

Figure 3A:
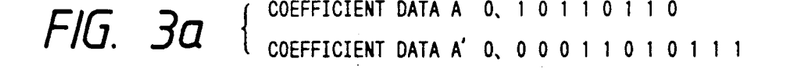
FIGS. 3a to 3c are views for explaining the manner of storing coefficient data in registers.
Figure 3B:
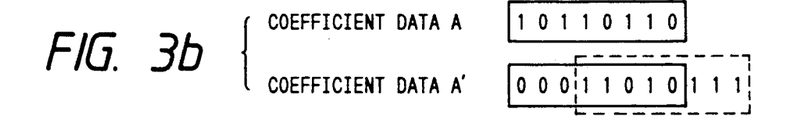
Figure 3C:
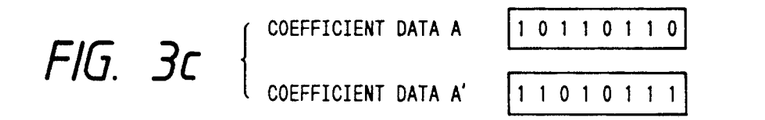

FIG. 3 is a view for explaining the method for registering coefficient data in the coefficient data registers. Let the coefficient data A be a coefficient data to be registered in the coefficient data register 22-1. Let the coefficient data A' be a coefficient data to be registered in the coefficient data register 22-2.

FIG. 3a shows an example of values given to the coefficient data A and A'. The coefficient data A is given as a value occupying eight binary digits. On the other hand, the coefficient data A' is given as a value occupying eleven binary digits.

There is no problem if the coefficient data register has a sufficient number of bits to accommodate all the digits of the given coefficient data. However, the coefficient data register does not always has such a sufficient number of bits. In other words, the coefficient data register may be short of bits.

FIG. 3b shows an example of ranges of bits which can be registered in the 8-bit coefficient registers.

Because the coefficient data A has eight digits, all digits can be registered. The portion surrounded by the solid line shows the range of bits which can be registered in the coefficient data register. On the other hand, because the coefficient data A' has eleven digits, all digits cannot be registered. Various registration ranges can be considered. For example, eight digits on and after the binary point may be registered as surrounded by the solid line in the drawing or eight digits on and after the fourth place to the right of binary point may be registered as surrounded by the broken line.

To improve accuracy in the multiplication result, however, it is desired that the registration range includes as many effective digits as possible. Therefore, in the case of the coefficient data A', it is desired that eight digits on and after the fourth place to the right of binary point which is the first effective digit are registered, in other words, the range surrounded by the broken line is registered.

FIG. 3c shows the values of bits registered in the coefficient data registers 22-1 and 22-2 in the manner as described above.

However, the following problem arises in the case where multiplication is carried out by using the thus registered coefficient data. Assuming that the value registered in the coefficient data register is a value of digits on and after the binary point, then the value registered in the coefficient data register 22-1 is just a value on and after the binary point. On the other hand, the value registered in the coefficient data register 22-2 is not so. The value is a value obtained by shifting the fourth place to the right of the binary point to the first place to the right of the binary point. In short, a value 8 times as large as the real value is registered.

Accordingly, it is necessary that the multiplication result obtained by using the value registered in the coefficient data register 22-2 is shifted reversely by the same shift quantity.

In other words, the binary point needs to be shifted left by three digits to thereby reduce the multiplication result to one-eighth.

The shift-quantity register 25-2 is provided for registering the value of 3 equivalent to this shift quantity of three digits. The barrel shifter 28 is provided for carrying out shifting processing practically for the multiplication result on the basis of the value registered in the shift-quantity register 25-2.

The shift quantity required in use of the coefficient data registered in the coefficient data register 22-1 is registered in the shift-quantity register 25-1. On the other hand, the shift quantity required in use of the coefficient data registered in the coefficient data register 22-2 is registered in the shift-quantity register 25-2. In the case as shown in FIG. 3, the value of 0 is registered in the shift-quantity register 25-1 because it is not necessary to shift the coefficient data A.

One of the shift-quantity registers 25-1 and 25-2 is selected by the multiplexer 26 in accordance with the selection on the coefficient data registers 22-1 and 22-2.

The delay circuit 24 is provided in the case where the selection signal used by the multiplexer 23 is also used by the multiplexer 26. The shifting operation of the barrel shifter 28 is not carried out before a certain time has elapsed after completion of the operation of the multiplier 21. The delay circuit 24 serves to delay the arrival of the selection signal to the multiplexer 26 for the above-mentioned certain time.

If two selection signals with a time difference are supplied instead of the one common selection signal, it is unnecessary to provide the delay circuit 24.

Because multiplication is carried out in such a multiplication block as described above, not only can the multiplication result be obtained with high accuracy but also the filtering characteristic can be changed in a real-time operation.

The case where real-time changing of the filtering characteristic is required at the sacrifice of some accuracy in the filtering processing is now considered. In this case, it is unnecessary to provide the shift-quantity registers and parts associated therewith, though it is necessary to provide the plurality of coefficient data registers and the multiplexers for switching them.

In this case, accuracy in the filtering processing may be lowered because the forward digit in the value registered in the coefficient data register is not always effective. However, real-time changing of the filtering characteristic is possible because the coefficient data can be switched at all times.

The multiplication block shown in FIG. 2 can be used in the aforementioned case where image data in a window are processed by group classified by coefficient data of the same value and can be used also in other cases.

Figure 9:
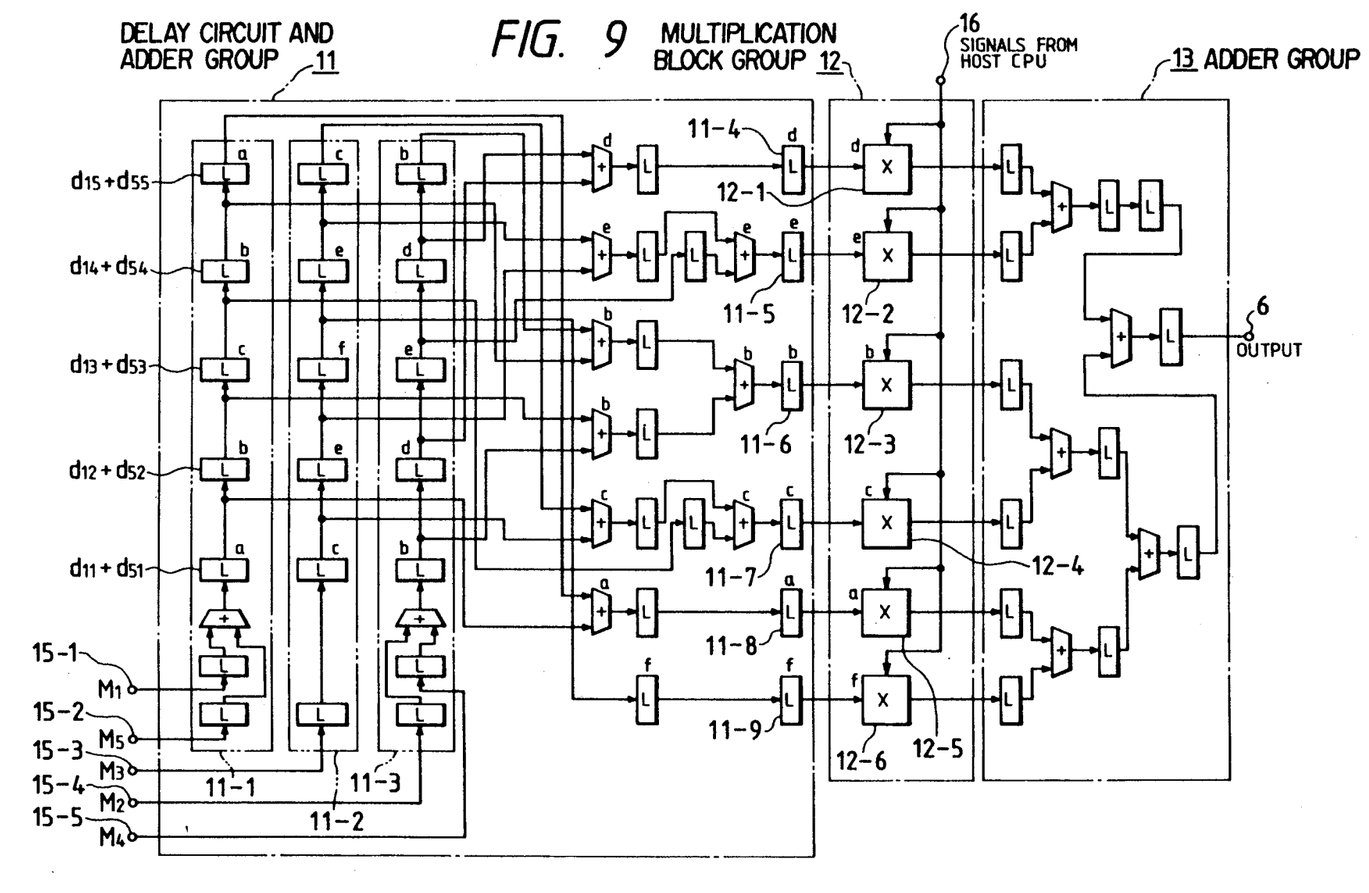
FIG. 9 is a detailed diagram of the image-processing integrated circuit device according to the present invention.

FIG. 9 is a detailed diagram of the image-processing integrated circuit device according to the present invention. In FIG. 9, items the same as or equivalent to those in FIG. 1 are referenced correspondingly. In FIG. 9, the reference numerals 11-1 through 11-3 designate delay circuit blocks, 11-4 through 11-9 latches, 15-1 through 15-5 input terminals, and 16 a plurality of signal terminals. In the drawing, the symbol "L" represents a latch, "+" represents an adder, and "×" represents a multiplication block. Further, latches and adders identified by a, b, c, d, e and f act as related to image data corresponding to the symmetrical positions a, b, c, d, e and f in FIG. 6, respectively.

Rows $M_1$, $M_5$, $M_3$, $M_2$ and $M_4$ (see FIG. 4) of image data constituting the window are supplied through the input terminals 15-1 to 15-5, respectively. Symmetrical rows are added in the delay circuit blocks 11-1 to 11-3, respectively.

When, for example, image data are as in FIG. 4, the first row $M_1$ of the image data and the fifth row $M_5$ of the image data are added in the delay circuit block 11-1. Corresponding image data in the two rows are added and then fed upward to the latches, successively. Consequently, upon completion of inputting of the last image data, values of $d_{15}+d_{55}$, $d_{14}+d_{54}$, $d_{13}+d_{53}$, $d_{12}+d_{52}$ and $d_{11}+d_{51}$ shown in FIG. 9 are latched by the five latches in the upper portion of the delay circuit block 11-1.

In the point of view of symmetrical positions as shown in FIG. 6, these values are the sums of data located in the positions a, b, c, b and a as noted in the sides of the latches, respectively.

Similarly, the delay circuit block 11-3 adds the second row $M_2$ of data and the fourth row $M_4$ of data. The delay circuit block 11-2 advances the middle row $M_3$ of image data without performing addition. Consequently, the image data located in the positions b, c, ... as noted in the sides of the latches are latched by those latches, respectively.

The values of the respective latches in the delay circuit blocks 11-1 to 11-3 are classified into groups by the symmetrical positions so that the values in every group are added by the corresponding one of the succeeding adders connected to the delay circuit blocks. Finally, the sum of image data in the symmetrical positions d appears in the latch 11-4. Similarly, the sums of image data in the symmetrical positions e, b, c, a and f appear in the latches 11-5, 11-6, 11-7, 11-8 and 11-9, respectively. Thus, in the delay circuit and adder group 11, image data are added up by the symmetrical positions within the window.

Then, in the multiplication block group 12, the results of the add-up are multiplied by the coefficient data, respectively. For example, in the multiplication block 12-1, the result of the add-up in the symmetrical positions d is multiplied by the coefficient data in the symmetrical positions d. Similarly, in the multiplication blocks 12-2, 12-3, 12-4, 12-5 and 12-6, multiplications related to the image data in the symmetrical positions e, b, c, a and f are carried out, respectively. The respective multiplying operations require a group of signals (see FIG. 2) from the host CPU 5, and the group of signals are given through the signal terminal 16.

The adder group 13 serves to add the multiplication results obtained by the multiplication blocks. It is unnecessary to select partners in this addition. In short, the multiplication results obtained by the multiplication block group can be added in no particular order. The latches in the adder group 13 serve to hold values and also to adjust the time for addition.

Thus, the result of addition is output as a filter output from the output terminal 6.

As described above, according to the present invention, the following effects are attained.

(a) Parts are reduced in number.

The delay circuit and adder group, the multiplication block group and the adder group can be integrated in the form of an image-processing integrated circuit device, and accordingly parts can be reduced in number compared with the prior art devices as shown in FIGS. 7 and 8.

(b) Speed in filtering processing is high.

Not only can the image data be fed into the delay circuit and adder group simultaneously (though the prior art device in FIG. 8 cannot carry out the simultaneous feeding of the image data), but also multiplications in the multiplication block group can be carried out in parallel and simultaneously by using exclusive multiplication blocks provided for symmetrical positions in the window. Accordingly, the speed in the filtering processing becomes high.

(c) The cost required for manufacturing integrated circuits can be reduced.

Because the image data to be multiplied by coefficient data of the same value in the filtering processing are added in advance to save the number of multiplication to one, the number of multipliers can be reduced. Accordingly, the cost required for manufacturing integrated circuits can be reduced.

(d) Real-time changing of the filtering characteristic can be made, so that a carefully thought out filtering processing can be carried out to answer the request for high picture quality.

Real-time changing of the filtering characteristic can be made by switching some kinds of predetermined coefficient data by switching means without rewriting the coefficient data.

(e) Not only can real-time changing of the filtering characteristic be made but also the accuracy in the filtering processing can be improved.

Because multiplication can be made with the best use of effective digits in coefficient data, high accuracy can be attained.

What is claimed is:

1. An image-processing integrated circuit device comprising:
   delay circuit and adder means for adding up image data in a window for every one of a group of said image data corresponding to coefficient data of the same value;
   multiplication block means, comprising a plurality of multiplication blocks, for multiplying the results of the additions performed by the delay circuit and adder means for said every group of ones of said image data by a corresponding one of said coefficient data, in which each of said multiplication blocks comprises:
   a multiplier;
   a plurality of coefficient data register means for registering coefficient data for every one of a plurality of different filtering characteristics; and
   first switching means responsive to at least one changeable selection signal, for switching said coefficient data to be fed from said plurality of coefficient data register means to said multiplier, said changeable selection signal being fed to each of said plurality of multipliers of said multiplication blocks simultaneously; and
   adder means for adding the results of the multiplication for all the groups of said image data obtained from said multiplication block means to thereby obtain a filter output.

2. An image processing integrated circuit device according to claim 1, wherein
   each said plurality of coefficient data register means registers said coefficient data corresponding to one of a plurality of different filtering characteristics after shifting said coefficient data to be registered by a predetermined number of digits so that a first significant digit of said coefficient data to be registered comes to the head of said coefficient data register; and in which
   each of said multiplication blocks further comprises:
   a plurality of shift-quantity register means, corresponding to said plurality of coefficient data register means, for registering a number of shift bits equal to the number of digits of shift of said coefficient data in said plurality of coefficient data register means;

barrel shifter means provided at the output side of said multiplier, for reversely shifting the digits of the results of multiplication; and second switching means for switching the quantity of shift to be fed from said plurality of shift-quantity register means to said barrel shifter means.

3. An image-processing integrated circuit device for processing image data comprising:

multiplication block means including a plurality of multiplication blocks each for multiplying one of said image data by coefficient data corresponding to said image data; and adder means for adding the results of the multiplications obtained from said multiplication block group to thereby obtain a filter output; wherein each said multiplication blocks includes a multiplier, a plurality of coefficient data register means for registering coefficient data for each of a plurality of different filtering characteristics, and switching means responsive to at least one changeable selection signal, for switching said coefficient data to be fed from said plurality of coefficient data register means to said multiplier, said changeable selection signal being fed to each of said plurality of multipliers of said multiplication block simultaneously.

4. In an image-processing integrated circuit device for processing image data comprising a multiplication block group including a plurality of multiplication block means each for multiplying one of said image data by coefficient data corresponding to said image data, and adder means for adding the results of the multiplications obtained from said multiplication block group to thereby obtain a filter output; the improvement comprising each of said multiplication block means comprising:

a multiplier, a plurality of coefficient data register means each for registering said coefficient data corresponding to one of a plurality of different filtering characteristics after shifting said coefficient data to be registered by a predetermined number of digits so that a first significant digit of said coefficient data to be registered comes to the head of said coefficient data register means, first switching means for switching the coefficient data to be fed from said plurality of coefficient data register means to said multiplier, a plurality of shift-quantity register means corresponding to said plurality of coefficient data register means, for registering a quantity of shift bits equal to the number of digits of shift of said coefficient data in said plurality of coefficient data register means;

barrel shifter means provided at the output side of said multiplier for reversely shifting the digits of the results of multiplication; and second switching means for switching the quantity of shift to be fed from said plurality of shift-quantity register means to said barrel shifter means.

* * * * *